United States Patent
Sforzin et al.

(10) Patent No.: US 12,525,993 B2
(45) Date of Patent: Jan. 13, 2026

(54) FAST MULTI-PAYLOAD-LENGTH ERROR-CORRECTING SYSTEM AND METHODS

(71) Applicant: Micron Technology, Inc., Boise, ID (US)

(72) Inventors: Marco Sforzin, Cernusco sul Naviglio (IT); Christophe Vincent Antoine Laurent, Agrate Brianza (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 18/631,840

(22) Filed: Apr. 10, 2024

(65) Prior Publication Data

US 2024/0356566 A1     Oct. 24, 2024

Related U.S. Application Data

(60) Provisional application No. 63/460,789, filed on Apr. 20, 2023.

(51) Int. Cl.
*H03M 13/15* (2006.01)
*H03M 13/11* (2006.01)

(52) U.S. Cl.
CPC ..... *H03M 13/152* (2013.01); *H03M 13/1108* (2013.01); *H03M 13/1575* (2013.01)

(58) Field of Classification Search
CPC ........... H03M 13/152; H03M 13/1108; H03M 13/1575; H03M 13/618
See application file for complete search history.

(56) References Cited

U.S. PATENT DOCUMENTS

| | | | |
|---|---|---|---|
| 2005/0160350 A1 | 7/2005 | Dror et al. | |
| 2011/0161773 A1 | 6/2011 | Martwick et al. | |
| 2016/0241273 A1* | 8/2016 | Shieh | H03M 13/3746 |
| 2017/0093528 A1 | 3/2017 | Oveis Gharan et al. | |
| 2018/0210789 A1* | 7/2018 | Chae | H03M 13/2927 |
| 2020/0142771 A1 | 5/2020 | Cho et al. | |

(Continued)

FOREIGN PATENT DOCUMENTS

| | | |
|---|---|---|
| EP | 1909191 | 4/2008 |
| KR | 20120125891 | 11/2012 |

(Continued)

OTHER PUBLICATIONS

"International Application Serial No. PCT US2024 023884, International Search Report mailed Jul. 23, 2024", 3 pgs.

(Continued)

*Primary Examiner* — Thien Nguyen
(74) *Attorney, Agent, or Firm* — Schwegman Lundberg & Woessner, P.A.

(57) ABSTRACT

Systems and methods for fast multi-length payload error correcting includes at least a decoder circuit. The decoder circuit receives a first input and receives a second input. The decoder circuit generates, based on the first input, a first decoded payload. The first decoded payload includes at least a first data or a first length and a first flip bit. The decoder circuit generates, based on the second input, a second decoded payload. The second decoded payload includes at least a second data of a second length and a second flip bit, the second length being different from the first length.

17 Claims, 7 Drawing Sheets

(56) References Cited

U.S. PATENT DOCUMENTS

2020/0396074 A1    12/2020  Hall et al.
2021/0091991 A1     3/2021  Yoffe et al.
2022/0415426 A1    12/2022  Sforzin et al.

FOREIGN PATENT DOCUMENTS

WO    2011032107    3/2011
WO    2012100193    7/2012

OTHER PUBLICATIONS

"International Application Serial No. PCT US2024 023884, Written Opinion mailed Jul. 23, 2024", 4 pgs.
"International Application Serial No. PCT US2024 023890, International Search Report mailed Aug. 8, 2024", 3 pgs.
"International Application Serial No. PCT US2024 023890, Written Opinion mailed Aug. 8, 2024", 3 pgs.
U.S. Appl. No. 18/631,870, filed Apr. 10, 2024, Fast Multi-Payload-Length Error-Correcting System and Methods.

\* cited by examiner

FAST MULTI-PAYLOAD-LENGTH ERROR-CORRECTING SYSTEM AND METHODS

PRIORITY APPLICATION

This application claims the benefit of priority to U.S. Provisional Application Ser. No. 63/460,789, filed Apr. 20, 2023, which is incorporated herein by reference in its entirety.

BACKGROUND

As memory devices decrease in size and increase in complexity, they can be more prone to errors. Additionally, errors may arise in the transit of a data stream. For example, errors may occur due to storage charge loss, random telegraph signal effects, coupling effects, de-trapping mechanisms, read disturb phenomena, quantum tunneling, and/or cosmic rays, just to name a few examples. Error correcting codes are used to locate and correct errors in data transmitted over an unreliable channel. As hardware becomes increasingly complex, improvements in error correcting codes are valuable to create more efficient electronic devices.

Historically, error correcting codes are designed for specific technological uses. This requires taking into account various use-case specific parameters when designing the error correcting code. For example, designing a Bose-Chaudhuri-Hocquenghem (BCH) code requires engineers to take into account many parameters such as data length, desired codeword length, desired number of errors capable of being corrected, time constraints on speed for error correction, among other factors. As a result, it is generally not possible to route multiple different data streams through an error correcting circuit designed for a specific use case. Being unable to use the same error correcting code for multiple different data streams makes error correction less efficient.

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

DETAILED DESCRIPTION

Figure 1:
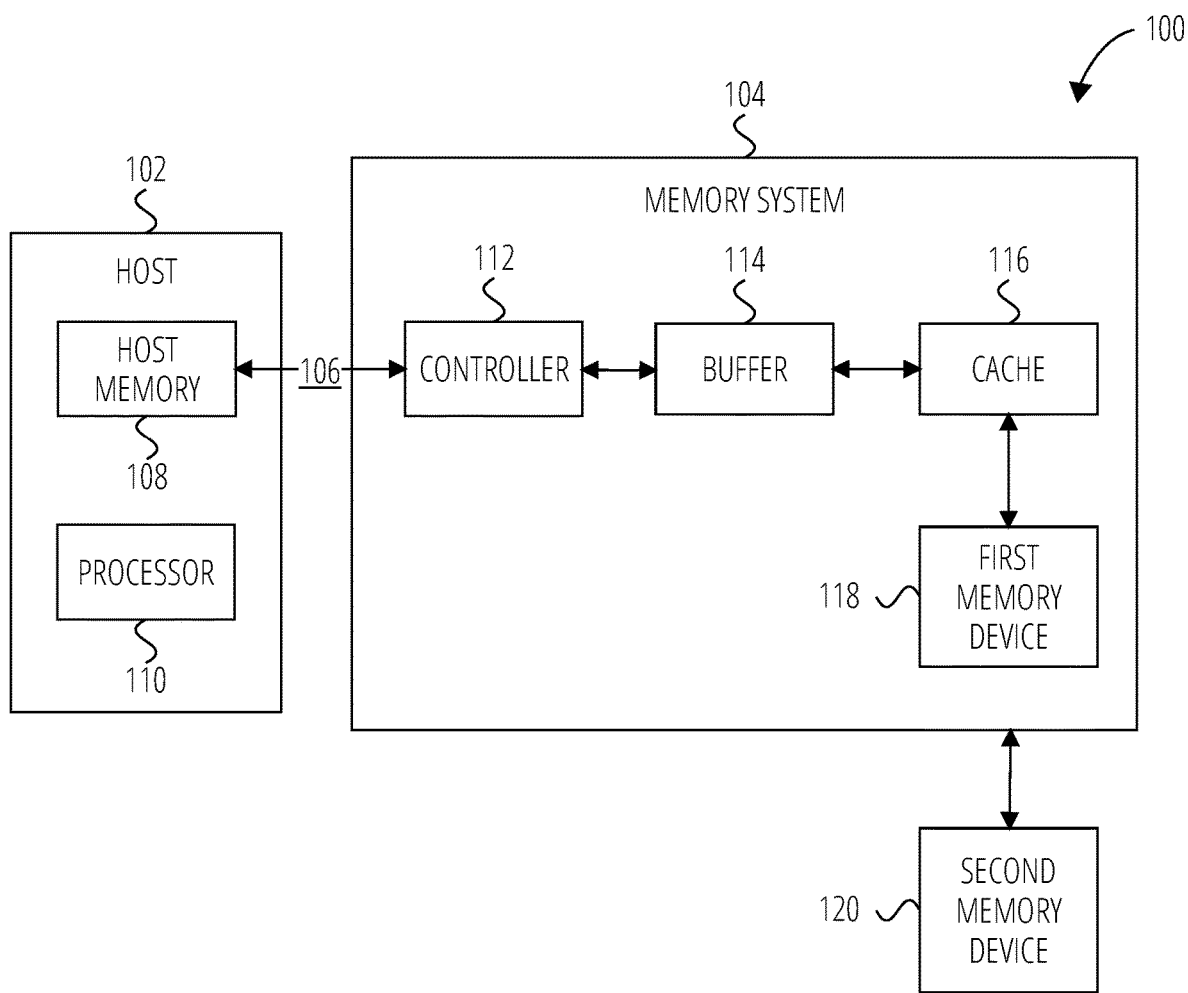
FIG. 1 illustrates generally a block diagram of an example computing system including a host and a memory device.

Systems and methods presented herein provide means for fast error correction of data payloads of multiple different lengths. The encoder and decoder of a multi-payload-length error correcting code receive a payload option along with the data payload. The payload option signifies the length of the data payload. The error correcting code is designed with a maximum input data payload length and multiple codewords. When a shorter data payload is encoded, the encoder generates a parity vector of a length equal to that when the maximum payload length is encoded. The encoder generates excess parity bits that are zero such that both a shorter data payload and data of the maximum payload length will have codewords of the same length. When decoded, the excess parity bits can be ignored. In an example, fast error correction can include or use syndrome decoding. Further, the error correcting code can be designed to maintain a flip property for each different data payload length.

Fast error correction of multiple payload lengths enables multiple streams to share an encoder and/or a decoder, thus saving area on a chip. For example, a memory optimized for a mobile market and a memory optimized for compute express link (CXL) generate data payloads of different lengths. Previously, it would not be possible for them to share an error correcting code, particularly a BCH code. In an example, the memory optimized for the mobile market and the memory optimized for CXL can use the same error correcting code and associated circuitry, physically saving area, which in turn reduces cost, while providing high reliability for both use cases. Other cross-platform use cases can similarly be realized.

Embodiments described herein include systems and methods involving error correcting codes to correct one or more errors while satisfying particular constraints that may be imposed by various applications. For example, applications involving execution-in place (XiP) memories may use such an error correcting code to reliably correct up to two errors while preserving a flip property.

In an example, an error correcting code process supplements a data vector with a parity vector to store enough extra information for the data vector to be reconstructed should one or more bits of data become corrupted. In some embodiments, the error correcting code process is based, at least in part, on parallel encoding and decoding techniques. Some embodiments involve a 2-bit error correcting binary Bose-Chaudhuri Hocquenghem (BCH) code. Such a BCH code may be designed to preserve a flip property of the data. In some embodiments, the BCH code is designed to encode and decode data vectors of multiple different lengths.

Herein, a data vector is supplemented with a parity vector to generate a codeword of an error correcting code. The process of generating a codeword (c) from a data vector (d) is referred to herein as encoding. In some embodiments, the data vector is encoded with a generator matrix (G) of the particular error correcting code to generate a codeword, according to $d \cdot G = c$. The generator matrix is generated according to $G = [I_k | P]$, where $I_k$ is a k-dimensional identity matrix and P is a parity matrix of the error correcting code.

Additionally or alternatively, the data vector may be encoded using the parity matrix. A parity vector (P) is generated by multiplying the data vector by the parity matrix (P): $p = d \cdot P$. The parity vector and the data vector are combined to generate a codeword. The error correcting code may be systematic or non-systematic. In a systematic error correcting code, the data vector is embedded in the codeword. A systematic codeword can be generated by appending the parity vector to the data vector. For example, $c = [p, d]$. In a non-systematic error correcting code, the parity bits of the parity vector are interspersed throughout the data vector to generate the codeword.

In an example, a codeword can be transmitted over a noisy channel. A recipient of the codeword can decode the codeword. If a received vector has errors, the error correcting code can locate and correct up to t errors. The number of errors an error correcting code can correct is based on the minimum Hamming distance ($d_{min}$) of the particular error correcting code. That is, a particular error correcting code can correct up to t errors, where:

$$t = \left\lfloor \frac{d_{min} - 1}{2} \right\rfloor$$

Decoding, as used herein, refers to the process of determining whether a received vector is a codeword. If the received vector us a codeword then the decoding includes decoding the data vector. If the received vector is not a codeword, then the decoding includes performing error correction(s) and decoding the data vector. In some embodiments, a parity check matrix (H) is used to check whether a received vector is a codeword, according to: $c \cdot H^T = 0$. That is, every codeword is orthogonal to the parity check matrix. A parity check matrix for a particular error correcting code can be derived from the generator matrix and is defined according to: $H = [-P^T | I_{n-k}]$. In binary error correcting codes, over GF(2), $-P^T = P^T$. Accordingly, for any received vector, y, the received vector is a codeword if $y \cdot H^T = 0$.

Additionally, or alternatively, syndrome decoding may be used as part of the error correcting code process. In some embodiments, a syndrome vector is computed from a received vector according to $S = y \cdot H^T$. Accordingly, the received vector is a codeword if the syndrome vector is zero, $S = 0$.

If $S \neq 0$, then one or more errors are present in the received vector. For linear codes, $y = c + e$, where e is an error vector. Since $c \cdot H^T = 0$, it follows that $S = e \cdot H^T$. If the syndrome vector for a received vector is associated with one error pattern, then error correction is required. If the syndrome vector for a received vector is associated with more than one error pattern, then error location and error correction is required. Some error correcting code processes use error locating polynomials and error correcting polynomials to locate and correct errors, respectively. For binary codes, error correction can include flipping the bits at the locations of the errors.

In an example, error detection or correction can be performed using various computing systems. FIG. 1 illustrates generally a block diagram of an example of a computing system 100 including a host device 102 and a memory system 104. The host device 102 includes a central processing unit (CPU) or processor 110 and a host memory 108. In an example, the host device 102 can include a host system such as a personal laptop computer, a desktop computer, a digital camera, a smart phone, a memory card reader, and/or Internet-of-thing enabled device, among various other types of hosts, and can include a memory access device, e.g., the processor 110. The processor 110 can include one or more processor cores, a system of parallel processors, or other CPU arrangement. Any one or more of the processors can be used to execute error detection or correction algorithms.

The memory system 104 includes a controller 112, a buffer 114, a cache 116, and a first memory device 118. The first memory device 118 can include, for example, one or more memory modules (e.g., single in-line memory modules, dual in-line memory modules, etc.). The first memory device 118 can include volatile memory and/or non-volatile memory, and can include a multiple-chip device that comprises one or multiple different memory types or modules. In an example, the computing system 100 includes a second memory device 120 that interfaces with the memory system 104 and the host device 102.

The host device 102 can include a system backplane and can include a number of processing resources (e.g., one or more processors, microprocessors, or some other type of controlling circuitry). The computing system 100 can optionally include separate integrated circuits for the host device 102, the memory system 104, the controller 112, the buffer 114, the cache 116, the first memory device 118, the second memory device 120, any one or more of which may comprise respective chiplets that can be connected and used together. In an example, the computing system 100 includes a server system and/or a high-performance computing (HPC) system and/or a portion thereof. Although the example shown in FIG. 1 illustrates a system having a Von Neumann architecture, embodiments of the present disclosure can be implemented in non-Von Neumann architectures, which may not include one or more components (e.g., CPU, ALU, etc.) often associated with a Von Neumann architecture.

In an example, the first memory device 118 can provide a main memory for the computing system 100, or the first memory device 118 can comprise accessory memory or storage for use by the computing system 100. In an example, the first memory device 118 or the second memory device 120 includes one or more arrays of memory cells, e.g., volatile and/or non-volatile memory cells. The arrays can be flash arrays with a NAND architecture, for example. Embodiments are not limited to a particular type of memory device. For instance, the memory devices can include RAM, ROM, DRAM, SDRAM, PCRAM, RRAM, and flash memory, among others.

In embodiments in which the first memory device 118 includes persistent or non-volatile memory, the first memory device 118 can include a flash memory device such as a NAND or NOR flash memory device. The first memory device 118 can include other non-volatile memory devices such as non-volatile random-access memory devices (e.g., NVRAM, ReRAM, FeRAM, MRAM, PCM), "emerging" memory devices such as a ferroelectric RAM device that includes ferroelectric capacitors that can exhibit hysteresis characteristics, a 3-D Crosspoint (3D XP) memory device, etc., or combinations thereof.

In some embodiments, the first memory device 118 is a ferroelectric random-access memory (FeRAM). FeRAM is a non-volatile persistent memory similar in structure to dynamic random-access memory (DRAM), but with a ferroelectric layer instead of a dielectric layer to achieve non-volatility. Some such non-volatile memory cells including a layer of ferroelectric material (e.g., lead zirconate titanate) exhibit a switchable polarization responsive to application of an electric field (e.g., bias voltage), corresponding to a logic state (e.g., a 1 or a 0). After removal of the electric field, the polarization stare of the ferroelectric material may remain stable for some period of time, accordingly suitable for some non-volatile memory applications.

In comparison to DRAM, FeRAM has relatively fast program/read time as compared to flash memory and uses less power between read/write operations. As an example, the controller 112 is a hybrid controller that controls aggregation of instructions in order to improve the latency performance of FeRAM such that it is rendered equal in latency performance to dynamic random-access memory (DRAM).

One example of an application that is rendered possible with FeRAM and the hybrid controller is that the large memory density of FeRAM can allow for larger logical-to-physical (L2P) maps such that L2P caching to NAND is prevented for large SSDs and thereby improving performance.

In one example, the non-volatile memory devices (e.g., first memory device 118) includes FeRAM. The FeRAM density can be 64 Gigabytes such that the size of persistent memory regions can be in the magnitude of Gigabytes. Accordingly, FeRAM can host different applications such as non-volatile instant boot image, non-volatile L2P table, non-volatile CMB queues and write buffers, PMR PCIe Bar or CXL access memory, non-volatile write cache or cyclic buffer for automotive, non-volatile output NAND RAIN buffer, etc. With the increase in available size for non-volatile storage in the FeRAM, persistent memory regions can now be multiple Gigabytes in the FeRAM and are not limited by the PLP hold-up capacitors.

In an example, the controller 112 comprises a media controller such as a non-volatile memory express (NVMe) controller. The controller 112 can be configured to perform operations such as copy, write, read, error correct, etc. for the first memory device 118. In an example, the controller 112 can include purpose-built circuitry and/or instructions to perform various operations. That is, in some embodiments, the controller 112 can include circuitry and/or can be configured to perform instructions to control movement of data and/or addresses associated with data such as among the buffer 114, the cache 116, and/or the first memory device 118 or the second memory device 120.

In an example, at least one of the processor 110 and the controller 112 comprises a command manager (CM) for the memory system 104. The CM can receive, such as from the host device 102, a read command for a particular logic row address in the first memory device 118 or the second memory device 120. In some examples, the CM can determine that the logical row address is associated with a first row based at least in part on a pointer stored in a register of the controller 112. In an example, the CM can receive from the host device 102 a write command for a logical row address, and the write command can be associated with second data. In some examples, the CM can be configured to issue, to non-volatile memory and between issuing the read command and the write command, an access command associated with the first memory device 118 or the second memory device 120. In some examples, the CM can issue, to the non-volatile memory and between issuing the read command and the write command, an access command associated with the first memory device 118 or the second memory device 120.

In an example, the buffer 114 comprises a data buffer circuit that includes a region of a physical memory used to temporarily store data, for example, while the data is moved from one place to another. The buffer 114 can include a first-in, first-out (FIFO) buffer in which the oldest (e.g., the first-in) data is processed first. In some embodiments, the buffer 114 includes a hardware shift register, a circular buffer, or a list.

In an example, the cache 116 comprises a region of a physical memory used to temporarily store particular data that is likely to be used again. The cache 116 can include a pool of data entries. In some examples, the cache 116 can be configured to operate according to a write-back policy in which data is written to the cache without the being concurrently written to the first memory device 118. Accordingly, in some embodiments, data written to the cache 116 may not have a corresponding data entry in the first memory device 118.

In an example, the controller 112 can receive write requests involving the cache 116 and cause data associated with each of the write requests to be written to the cache 116. In some examples, the controller 112 can receive the write requests at a rate of thirty-two (32) gigatransfers (GT) per second, such as according to or using a CXL protocol. The controller 112 can similarly receive read requests and cause data stored in, e.g., the first memory device 118 or the second memory device 120, to be retrieved and written to, for example, the host device 102 via the interface 106.

In an example, the interface 106 can include any type of communication path, bus, or the like that allows for information to be transferred between the host device 102 and the memory system 104. Non-limiting examples of interfaces can include a peripheral component interconnect (PCI) interface, a peripheral component interconnect express (PCIe) interface, a serial advanced technology attachment (SATA) interface, and/or a miniature serial advanced technology attachment (mSATA) interface, among others. In an example, the interface 106 includes a PCIe 5.0 interface that is compliant with the CXL protocol standard. Accordingly, in some embodiments, the interface 106 supports transfer speeds of at least 32 GT/s.

As similarly described elsewhere herein, CXL is a high-speed central processing unit (CPU)-to-device and CPU-to-memory interconnect designed to enhance compute performance. CXL technology maintains memory coherency between the CPU memory space (e.g., the host memory 108) and memory on attached devices or accelerators (e.g., the first memory device 118 or the second memory device 120), which allows resource sharing for higher performance, reduced software stack complexity, and lower overall system cost. CXL is designed to be an industry open standard interface for high-speed communications as accelerators are increasingly used to complement CPUs in support of emerging data-rich and compute-intensive applications such as artificial intelligence and machine learning.

Figure 2:
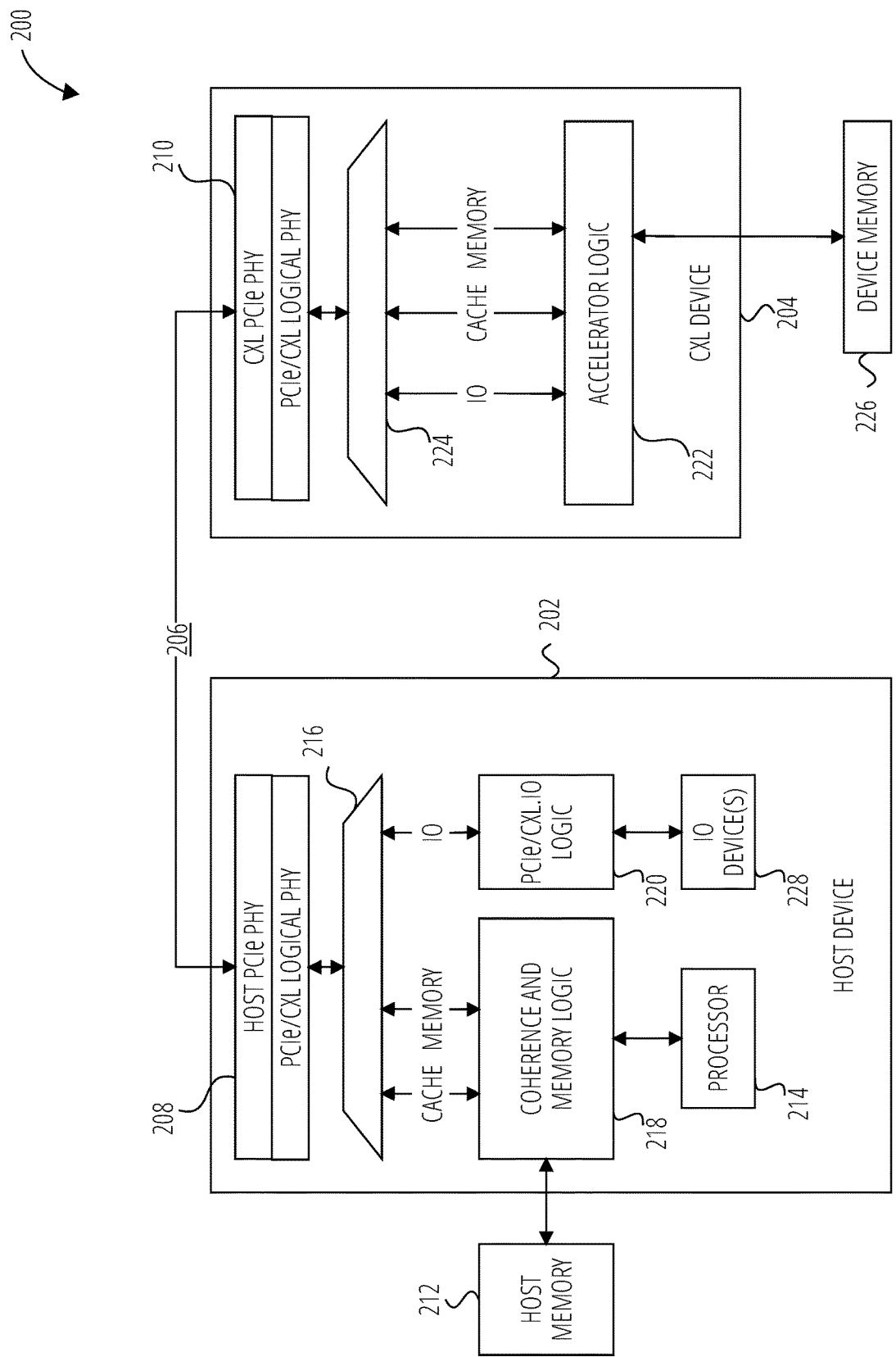
FIG. 2 illustrates generally a block diagram of an example system with a host and an accelerator device.

FIG. 2 illustrates generally an example of a CXL system 200 that uses a CXL link 206 to connect a host device 202 and a CXL device 204. In an example, the host device 202 comprises or corresponds to the host device 102 and the CXL device 204 comprises or corresponds to the memory system 104 from the example of the computing system 100 in FIG. 1. A memory system command manager can comprise a portion of the host device 202 or the CXL device 204. In an example, the CXL link 206 can support communications using multiplexed protocols for caching (e.g., CXL-.cache), memory accesses (e.g., CXL.mem), and data input/output transactions (e.g., CXL.io). CXL.io can include a protocol based on PCIe that is used for functions such as device discovery, configuration, initialization, I/O virtualization, and direct memory access (DMA) using non-coherent load-store, producer-consumer semantics. CXL.cache can enable a device to cache data from the host memory (e.g., from the host memory 212) using a request and response protocol. CXL.memory can enable the host device 202 to use memory attached to the CXL device 204, for example, in or using a virtualized memory space. In an example, CXL.memory transactions can be memory load and store operations that run downstream from or outside of the host device 202.

In the example of FIG. 2, the host device 202 includes a host processor 214 (e.g., comprising one or more CPUs or cores) and IO device(s) 228. The host device 202 can comprise, or can be coupled to, host memory 212. The host device 202 can include various circuitry or logic configured to facilitate CXL-based communications and transactions with the CXL device 204. For example, the host device 202 can include coherence and memory logic 218 configured to implement transactions according to CXL.cache and CXL.mem semantics, and the host device 202 can include PCIe logic 220 configured to implement transactions according to CXL.io semantics. In an example, the host device 202 can be configured to manage coherency of data cached at the CXL device 204 using, e.g., its coherence and memory logic 218.

The host device 202 can further include a host multiplexer 216 configured to modulate communications over the CXL link 206 (e.g., using the PCIe PHY layer). The multiplexing of protocols ensures that latency-sensitive protocols (e.g., CXL.cache and CXL.memory) have the same or similar latency as a native processor-to-processor link. In an example, CXL defines an upper bound on response times for latency-sensitive protocols to help ensure that device performance is not adversely impacted by variation in latency between different devices implementing coherency and memory semantics.

In an example, symmetric cache coherency protocols can be difficult to implement between host processors because different architectures may use different solutions, which in turn can compromise backward compatibility. CXL can address this problem by consolidating the coherency function at the host device 202, such as using the coherence and memory logic 218.

The CXL device 204 can include an accelerator device that comprises various accelerator logic 222. In an example, the CXL device 204 can comprise, or can be coupled to, CXL device memory 226. The CXL device 204 can include various circuitry or logic configured to facilitate CXL-based communications and transactions with the host device 202 using the CXL link 206. For example, the accelerator logic 222 can be configured to implement transactions according to CXL.cache, CXL.mem, and CXL.io semantics. The CXL device 204 can include a CXL device multiplexer 224 configured to control communications over the CXL link 206.

Figure 3:
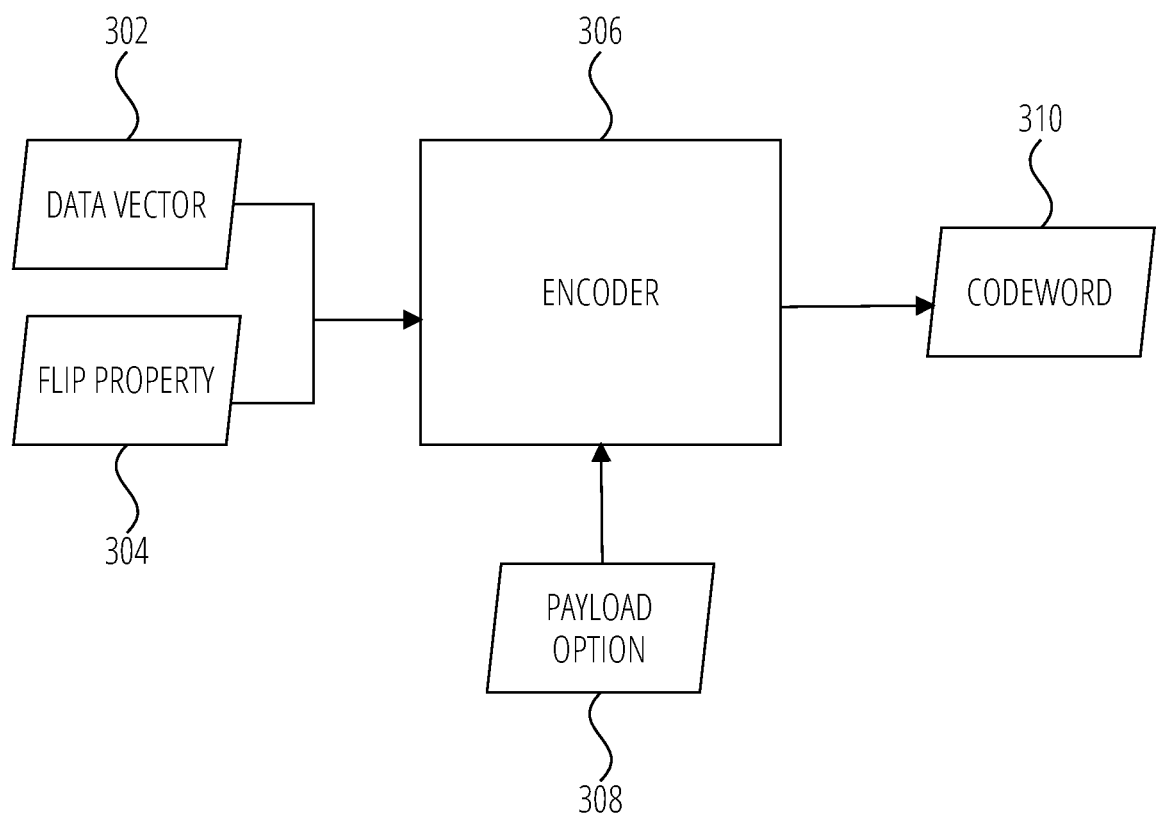
FIG. 3 illustrates an encoder, in accordance with some embodiments.

FIG. 3 illustrates an encoder 306, in accordance with some embodiments. In the example embodiment of FIG. 3, a data vector 302 and a flip property 304 are inputs to the encoder 306. The encoder 306 implements an error correcting code to encode inputs and generate a codeword 310. The error correcting code may be designed such that codewords generated by the encoder 306 preserve the flip property. That is, a bitwise flip of a codeword of the error correcting code can also be a codeword. The error correcting code may be, for example, a binary BCH code capable of correcting up to two errors.

The data vector 302 may be any data vector as defined herein. According to some embodiments, the data vector 302 can comprise data of multiple different lengths. For example, the encoder 306 may be capable of encoding data vectors of two different lengths. In other embodiments, the encoder may be capable of encoding data of four different lengths. In general, the encoder may be capable of encoding data of n different lengths. The particular lengths of the data vector 302 that the encoder 306 is capable of encoding is defined based on the design of the error correcting code implemented by the encoder 306.

The flip property 304 indicates the polarity of the data vector 302. In one example, the data vector 302 is binary and the flip property 304 is a bit that is zero when the data vector 302 is of correct polarity, and the flip property 304 is one when the data vector 302 is of inverted polarity. In some embodiments, the flip property 304 may be multiple bits of data, a vector, or any other form of input indicating the polarity of the data vector 302. The flip property 304 enables the data vector 302 polarity to be inverted for XiP implementations, among other use cases. Other embodiments may omit the flip property 304, for example, when XiP is not implemented.

The inputs into the encoder that are encoded to generate the codeword are collectively referred to as a payload. For example, the data vector 302 and the flip property 304 collectively form the payload in the example embodiment of FIG. 3. The codeword 310 is a codeword of the error correcting code implemented by the encoder 306.

In the example embodiment of FIG. 3 the encoder 306 additionally receives a payload option 308. The payload option 308 indicates the length of the payload. The payload option 308 enables the encoder to handle data vectors 302 of multiple different lengths. In an example where the encoder 306 is capable of encoding data vectors 302 of two different lengths, the payload option 308 is a bit that is zero when the data vector 302 is of the shorter length, and the payload option 308 is one when the data is of the longer length. In another example where the encoder 306 is capable of encoding data vectors 302 of four different lengths, the payload option 308 may represent any of four different values, each value associated with a particular data length. Other embodiments may omit the payload option 308, for example, if the encoder 306 is only required to process data vectors 302 of a single length.

In one illustrative example, the error correcting code is a BCH code capable of correcting up to two errors and can process data vector 302 of two different lengths. In this example, the data vector 302 may be of a first length of 256 bits, or a second length of 276 bits. In other words, the second data length is equal to the first data length plus 20 bits. In this illustrative example, the flip property 304 is a single bit indicating data polarity. Hence, the encoder 306 is configured to receive a first payload of a shorter length of 257 bits (256 bits for the data vector 302+1 bit for the flip property 304). The encoder is configured to receive a second payload of a longer length of 277 bits (276 bits for the data vector 302+1 bit for the flip property 304). The payload option 308 is a bit in this example since there are two possible payload lengths. The payload option 308 is, for example, zero for payloads of the shorter length (257 bits) and one for payloads of the longer length (277 bits). As referenced herein, the difference in length between the longer length and the shorter length is referred to as a long-short delta. For example, this illustrative example has a long-short delta of 20 bits. The lengths and dimensions described herein are in reference to one illustrative example, where the error correcting code was designed for use with specific applications. The lengths and dimensions can be designed for any application and therefore the shorter and longer lengths can be any values in other examples of these embodiments.

The error correcting code is designed to process data vectors 302 of multiple different lengths. A codeword of an error correcting code has length n, according to some embodiments. In a generic example, the error correcting code processes data vectors 302 of two different lengths: a longer data vector payload and a shorter data vector payload. The longer data vector payload has length k. As a result, for example, the parity vector may have a length (n−k). The shorter data vector payload has length (k−x), where x represents the long-short delta.

To generate parity vectors for data vectors of multiple different lengths, the error correcting code is designed to produce codewords of a primitive length, N, which is greater than the length of any input data vector 302 that the error correcting code is designed to encode. That is, the encoding is further designed to provide a 'shortening' of the primitive length of the codeword, N.

According to some embodiments, the primitive length is $N=p^i−1$, where p is a prime number, and i is a positive integer. For example, an error correcting code designed over a binary Galois field can have a primitive length $N=2^i−1$ (i.e., p=2 for a binary Galois field). In other embodiments, the primitive length may be differently defined, such as defined differently in designing the error-correcting code.

The 'shortening' refers to establishing a set of positions in the primitive length codeword, which has N total positions, to fix at zero. As a result of the zeroed positions, the rows in the transpose parity check matrix, $H^T$, are not involved in syndrome computation.

In designing the error correcting code with the primitive length codewords, a parity matrix is generated for the primitive length codewords, termed a primitive parity matrix herein. The 'shortening' is provided, in part, by the primitive parity matrix, and submatrices thereof. The primitive parity matrix can be generated from the generator polynomial associated with the error correcting code. The dimensions of the primitive parity matrix depend on the designed primitive length of the codewords, N, and the designed length of the parity vector.

According to some embodiments, the error correcting code is further designed to have a number of rows in the primitive parity matrix that have the "all-one" property. That is, a sum of all the values in the row over the finite field (e.g., Galois Field) is one. For example, if the error correcting code is defined over a binary finite field, the sum would be an XOR sum of all values in the row.

According to some embodiments, the error correcting code is further designed to have a number of rows in the primitive parity matrix that have an "all-zero" pattern. The all-zero pattern refers to a set of rows that form a first matrix. When a vector containing all ones is left multiplies the first matrix, the result is zero. That is, multiplying the rows with the all-zero property by an all-one vector equals zero. The rows with the all-zero property and the rows with the all-one property are used to provide the 'shortening,' as described further below.

In embodiments where the error correcting code processes payloads of two different lengths, the primitive parity matrix is designed to be subdivided to form a short-code parity matrix ($P_{short}$), a long-code parity matrix ($P_{long}$), and a long-short delta parity matrix ($P_{delta}$). The short-code parity matrix can be used to encode a payload of the shorter length. The long-code parity matrix can be used to encode a long payload. The long-short delta parity matrix is used to encode the long-short delta data positions. The long-code parity matrix, the short-code parity matrix, and the long-short delta parity matrix are submatrices of the primitive parity matrix.

The short-code parity matrix and the long-short delta parity matrix are also each submatrices of the long-code matrix. That is, each row of the short-code parity matrix and the long-short delta parity matrix is also part of the long-code parity matrix. According to exemplary embodiments, the short-code parity matrix and the long-short delta parity matrix partition the long-code matrix. That is, each row of the long-code parity matrix is also part of either of the short-code parity matrix or the long-short delta parity matrix:

$$P_{long} = \begin{bmatrix} P_{short} \\ P_{delta} \end{bmatrix}.$$

The short-code parity matrix is designed by identifying a number of rows in the primitive parity matrix with the all-one property. In other words, the short-code parity matrix has a codeword that is an all-one vector. The number of rows with the all-one property that form the short-code parity matrix is equal to the length of the shorter data vector. The rows with the all-one property in the short-code parity matrix may be non-consecutive rows in the primitive parity matrix.

The long-short delta parity matrix is designed by identifying a number of rows in the primitive parity matrix with the all-zero property. The number of rows with the all-zero property that form the long-short delta parity matrix is equal to the long-short delta. The rows with the all-zero property in the long-short delta parity matrix may be non-consecutive in the primitive parity matrix.

The long-code parity matrix includes the rows that make up both the short-code parity matrix and the long-short delta parity matrix. In other words, the long-code parity matrix also has a codeword that is an all-one vector. The long-code parity matrix includes both rows with the all-one property and rows with the all-zero property. The rows that comprise the long-code parity matrix may be non-consecutive in the primitive parity matrix.

According to some embodiments, the remaining positions in the primitive parity matrix are to be zero or otherwise ignored. That is, since these positions are not necessary to encode either the longer payload or the shorter payload, these positions are excluded from computations relating to encoding the long code or the short code.

The encoder 306 receives a payload including a data vector 302, d, for example, by detecting it via circuitry components. According to some embodiments, the data bits in data positions that comprise the data vector 302 are detected at specific data positions in the circuitry. As a result, the input is effectively zero at data positions where no input is detected. The data vector 302 can be a short data vector, $d_{short}$, or a long data vector, $d_{long}$.

The short-code parity matrix, $P_{short}$ (which is comprised within the long-code matrix) is used to generate a parity vector from a short data vector, $d_{short}$, according to: $d_{short} \cdot P_{short} = p$. The short codeword is generated by combining the parity vector, p, with the short data vector, for example: $c_{short} = [d_{short}, p]$. The rows of the long-short delta parity matrix are not involved in encoding the short data vector since no input is detected at these rows (e.g., zeroed out).

The long-code parity matrix, X, is used to generate a parity vector from a long data vector, d, according to: $d_{long} \cdot P_{long} = p$. The long codeword is generated by combining the parity vector with the long data vector, for example: $c_{long} = [d_{long}, p]$. In both the instance of a short data vector, $d_{short}$, or a long data vector, $d_{long}$, the generated parity vector is the same length. A long codeword, $c_{long}$, is longer than a short codeword, $c_{short}$.

As a result, the same parity matrix (the long-code parity matrix) can be used to encode a short payload as well as a long payload. When a short payload is detected, the input at each row associated with the long-short delta parity matrix is effectively zero, resulting in computations effectively involving the short-code parity matrix. When a long payload is detected, the input at each row associated with the long-short delta parity matrix has an input dependent on the values contained in the long payload, resulting in computations involving the long-code parity matrix. In some embodiments, the long-code parity matrix is implemented in hardware. In some embodiments, the whole primitive parity matrix is implemented in hardware.

Returning to the illustrative example, the error correcting code is designed around a Galois field GF ($2^9$) in order to be large enough to accommodate payloads of lengths 257 bits and 277 bits. Accordingly, the primitive length is N=$2^9$−1=511. In this illustrative example, the binary BCH code capable of correcting up to two errors is designed such that there are 19 parity bits. Hence, there are 492 bits remaining for data, which is sufficient to contain either the 277-bit payload or the 257-bit payload.

In this example, the primitive parity matrix has 19 columns and 492 rows, referred to herein as $P_{492}$. The primitive parity matrix is designed with the error correcting code to position particular rows for multiplication by particular payload bit positions. For example, take $P_{277}$ as the long-code parity matrix. $P_{277}$ is a sub-matrix of $P_{492}$. $P_{277}$ can be partitioned into sub-matrices $P_{257}$ and $P_{20}$, where $P_{257}$ is the short-code parity matrix, and $P_{20}$ is the long-short delta parity matrix.

In one example, the rows of the sub-matrices are placed in particular rows of $P_{492}$. For example, the rows of $P_{277}$ are placed in rows 1-11, 13-276, 412, and 474 of $P_{492}$. Similarly, the rows of $P_{20}$ are placed in rows 1, 3-11, 13-19, 24, 154, and 474, while the rows of $P_{257}$ are place in rows 2, 20-23, 25-153, 155-276, and 412 of $P_{492}$. The remaining rows of $P_{492}$ are not relevant to encoding the payload.

The resulting primitive parity matrix $P_{492}$ can be used to generate parity vectors for payloads of two different lengths. The encoder 306 combines the resulting parity vector with the data vector 302 and payload option 308 to generate the codeword 310, where, for example, c=[d, FP, p, PO], where d is the data vector 302, FP is the flip property 304, P is the parity vector generated by $P_{492}$, and PO is the payload option 308.

It shall be appreciated that example(s) herein of data vectors of two different lengths are meant to be illustrative and not limiting. In embodiments where the error correcting code processes more than two different lengths of data vectors, the method of 'shortening' the codeword through a primitive parity matrix can be expanded to include multiple different lengths. For example, the primitive parity matrix can be subdivided into additional submatrices with all-one and all-zero property rows as appropriate for additional length-code parity matrix and respective delta matrices. For example, take an embodiment with data vectors of three different lengths: a short vector, a medium vector, and a long vector. Each length would have a respective parity matrix as a submatrix of the primitive parity matrix composed of rows with the all-one property. Additionally, the primitive parity matrix would have a short-medium delta parity matrix and a medium-long delta parity matrix, each composed of rows with the all-zero property. In other embodiments, vectors of different lengths may be passed through multiple primitive parity matrices in series of varying sizes to provide necessary 'shortening' to each successive codeword.

Encoding data of multiple lengths enables the encoder 306 to be shared by multiple different applications. This has a benefit of reducing area occupancy of the encoder(s) on multiple-purpose or general-purpose processor or a chip. Area reduction can help improve performance and cost effectiveness of the chip. In an example, the encoder 306 is configured to encode data of multiple different lengths and is highly accurate across the multiple different lengths.

Figure 4:
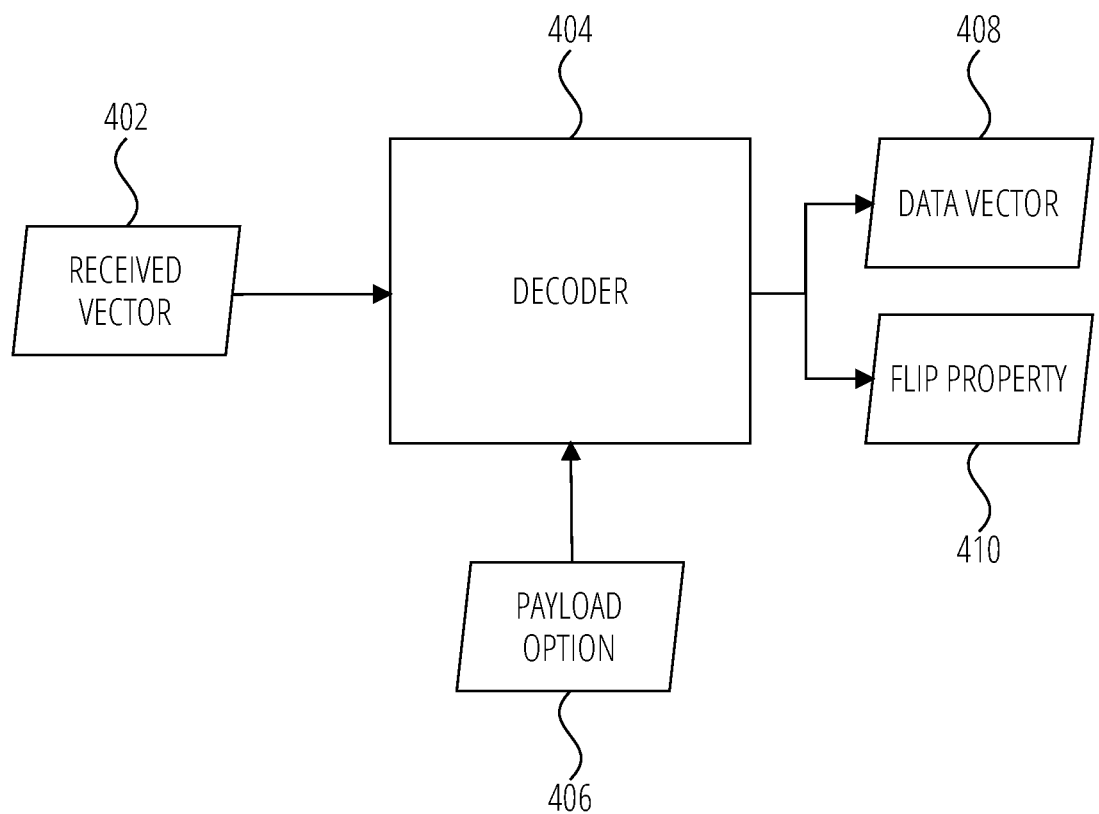
FIG. 4 illustrates a decoder, in accordance with some embodiments.

FIG. 4 illustrates a decoder 404, in accordance with some embodiments. In the example embodiment of FIG. 4, a received vector 402 is an input to the decoder 404. The decoder 404 implements an error correcting code to decode the received vector 402 and generate a payload that includes a data vector 408 and a flip property 410. The error correcting code is the same error correcting code used to encode the payload. The error correcting code may be, for example, a binary BCH code capable of correcting up to two errors. Other codes can similarly be used.

The data vector 408 can be characterized in the same manner as the data vector 302 of FIG. 3, although the data vector 302 and the data vector 408 are not necessarily the same data. Similarly, the flip property 410 can be characterized in the same manner as the flip property 304 of FIG. 3, although the flip property 304 and the flip property 410 are not necessarily the same flip property. The payload option 406 can be characterized in the same manner as the payload option 308 of FIG. 3, although the payload option 308 and the payload option 406 are not necessarily the same payload option. The decoder 404 receives the payload option 406 to indicate what length the resultant decoded payload (e.g., data vector 408 and flip property 410) will have.

The received vector 402 may or may not be a codeword of the error correcting code. The decoder 404 determines whether errors are present in the received vector 402. If the received vector 402 is a codeword of the error correcting code, then errors are determined to not be present. If the received vector 402 is not a codeword of the error correcting code, then error(s) are determined to be present and the error(s) must be located and corrected in order to generate the payload of the data vector 408 and the flip property 410.

In one example, the received vector 402 is the codeword 310 of FIG. 3, where the encoder 306 and the decoder 404 are based on the same error correcting code. The decoder 404 accordingly can determine errors are not present in the received vector 402 because it is the codeword 310. The decoder 404 decodes the received vector 402 to generate the data vector 408 and the flip property 410. Since the received vector 402 is the codeword 310, the data vector 408 is understood to be the data vector 302 and the flip property 410 is understood to be the flip property 304 in this example. Similarly, in this example, each of the payload option 308 and the payload option 406 would supply the same value to the encoder 306 and decoder 404, respectively.

In another example, the received vector 402 is not the codeword 310 of FIG. 3 because an error was introduced in transmitting the codeword 310, where the encoder 306 and decoder 404 are based on the same error correcting code. That is, the received vector 402 is supposed to be equal to the codeword 310, but an error occurred while the received vector 402 was in transit over a noisy channel. The decoder 404 determines one or more errors are present because the received vector 402 is not a valid codeword of the error correcting code (e.g., using the parity check matrix). The decoder 404 locates and corrects the error. The resultant corrected word should be the codeword 310. The codeword 310 can then be decoded by the decoder 404 to generate the data vector 408 (equivalent to data vector 302 in this example) and the flip property 410 (equivalent to the flip property 304 in this example), as discussed in the paragraph above.

In some embodiments, the decoder 404 uses syndrome decoding to locate and correct up to t errors. An example embodiment of a syndrome decoding process is discussed in reference to FIG. 5.

Figure 5:
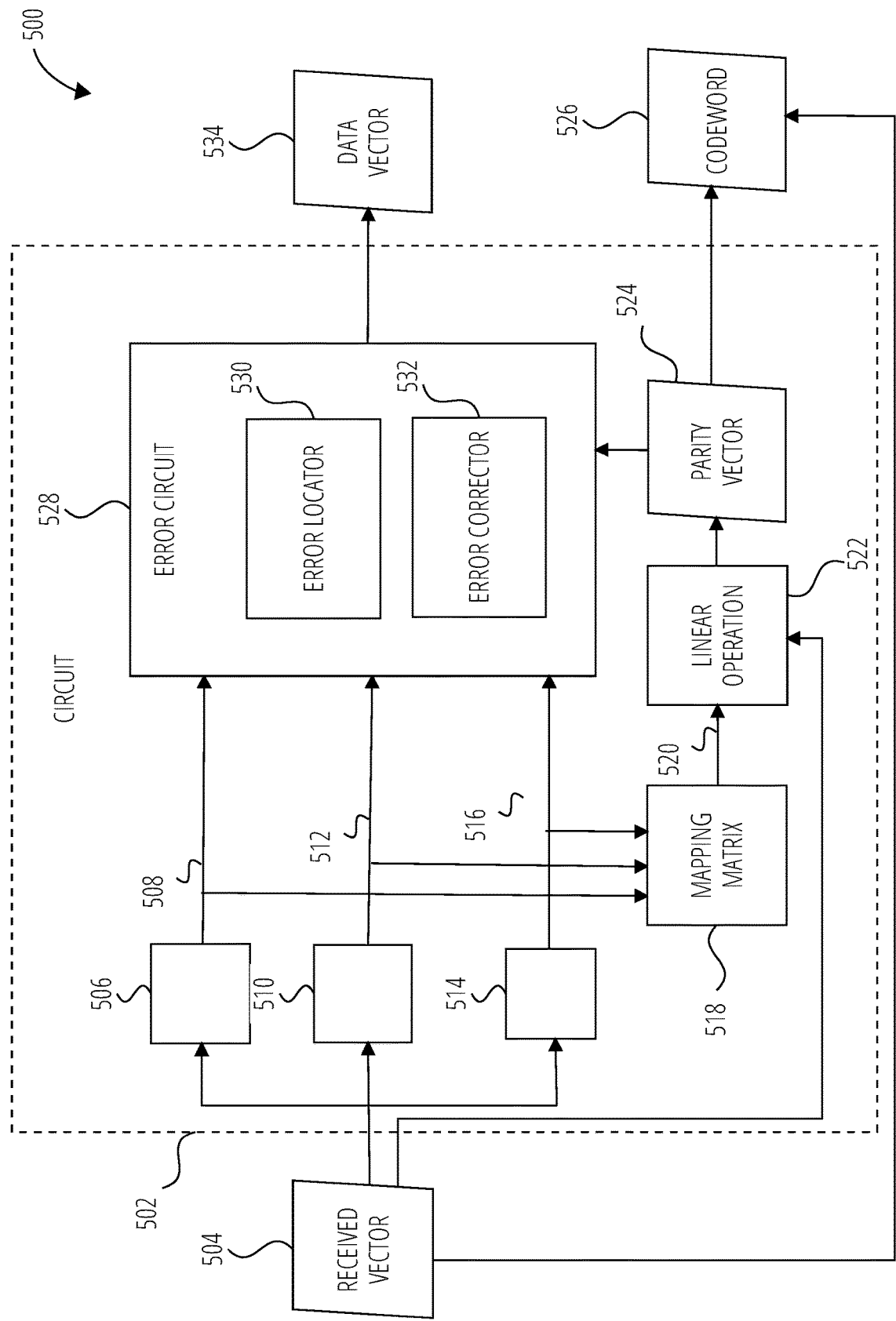
FIG. 5 illustrates an error correction system, in accordance with some embodiments

FIG. 5 illustrates an error correction system 500, in accordance with some embodiments. The error correction system 500 includes at least a circuit 502. The circuit 502 may, for example, be the encoder 306 of FIG. 3 and/or the decoder 404 of FIG. 4. The error correction system 500 takes advantage of symmetries in a designed error correcting code to enable using syndrome coefficients to compute a parity vector. Computation of a parity vector by the error correction system 500 can be used both in encoding processes, as previously discussed, or in decoding processes to determine whether error(s) are present and, if so, enable error correction. According to some embodiments, the error correcting code is a BCH code, such as a BCH code configured to correct up to two errors.

The circuit 502 receives a received vector 504 to be encoded or decoded. For example, in the case where the received vector 504 is to be encoded, the received vector 504 contains a payload to be encoded. In another example, when the received vector 504 is to be decoded, the received vector 504 may be a codeword (e.g., codeword 310) that has been transmitted over a noisy channel and is received by the circuit 502. In such an example, the received vector 504 includes a received data vector and a received parity vector. The received vector 504 may be a codeword of the error correcting code, or may have an addition of a number of errors. For example, because the error correcting code is a linear code, the received vector 504, y, can be represented by y=C+e, where c is a codeword of the error correcting code, and e is an error vector. If there are no errors, then the error vector can be represented as an all-zero vector.

The received vector 504 is provided to each of a first syndrome coefficient generator 506 to generate a first syndrome coefficient 508, a second syndrome coefficient generators 510 to generate a second syndrome coefficient 512, and a third syndrome coefficient generators 514 to generate a third syndrome coefficient 516. The number of syndrome coefficient generators is illustrative in the embodiment of FIG. 5. Other embodiments may have additional of fewer syndrome coefficient generators that generate respective other syndrome coefficients. The number of syndrome coefficients, and in turn the number of syndrome coefficient generators, is based on the design of the particular error correcting code to be used.

The first syndrome coefficient generator 506 generates the first syndrome coefficient 508. According to some embodiments, the first syndrome coefficient 508 is generated according to $S_0=y(1)$, where $S_0$ is the first syndrome coefficient 508, and y is the received vector 504 in polynomial form. The first syndrome coefficient 508 can be a scalar value according to this illustrative embodiment.

The second syndrome coefficient generator 510 generates the second syndrome coefficient 512. According to some embodiments, the second syndrome coefficient 512 is generated according to $S_1=y(\alpha)$, where $S_1$ is the second syndrome coefficient 512, y is the received vector in polynomial form, and ox is a primitive element of the Galois field over which the error correcting code is based. The second syndrome coefficient 512 can be a vector according to this illustrative embodiment, with a length equal to the dimension of the Galois field.

The third syndrome coefficient generator 514 generates the third syndrome coefficient 516. According to some embodiments, the third syndrome coefficient 516 is generated according to $S_3=y(\alpha^3)$, where $S_3$ is the third syndrome coefficient 516, y is the received vector in polynomial form, and $\alpha$ is a primitive element of the Galois field over which the error correcting code is based. The third syndrome coefficient 516 can be a vector according to this illustrative embodiment, with a length equal to the dimension of the Galois field.

In general, there may be additional or fewer syndrome coefficients than the first syndrome coefficient 508, the second syndrome coefficient 512, and the third syndrome coefficient 516. Each syndrome coefficient can be associated with a syndrome coefficient generator. Each syndrome coefficient, $S_j$, is generated according to $S_j=y(\alpha^j)$, for any j=0, 1 ... 2t−1, where t is the number of errors the error correcting code is capable of correcting.

Syndrome coefficients differ from a syndrome vector but are related. According to some embodiments, $[S_0, S_1, S_3]=S \cdot E$, where E is an invertible mapping matrix. Accordingly, it can be proven that:

$$E = \begin{bmatrix} 1 & 1 & 1 \\ 1 & \alpha & \alpha^3 \\ \cdots & \cdots & \cdots \\ 1 & \alpha^{2k-1} & \alpha^{3(2k-1)} \end{bmatrix}$$

In this example, E is invertible, and $F=E^{-1}$, where F represents another mapping matrix, mapping matrix 518. Accordingly, $S=[S_0, S_1, S_3] \cdot F$.

In general, when there are additional or fewer syndrome coefficients, $[S_0, S_1, \ldots ]=S \cdot E$. Similarly, in general, E can be represented by:

$$E = [E_0, E_1, \ldots ], \text{ where: } E_j = \begin{bmatrix} 1 \\ \alpha^j \\ \cdots \\ \alpha^{j(2k-1)} \end{bmatrix}$$

Consequently, a parity vector can be computed from a syndrome vector. Let the received vector be defined by $y=[\pi, d]$, where $\pi$ is the received parity vector and d is the received data vector. Accordingly, $$S = y \cdot H^T = [\pi, d] \cdot \begin{bmatrix} I \\ P \end{bmatrix} = \pi + d \cdot P.$$

If the received parity vector is an all-zero vector, then:

$$S = [0, d] \cdot \begin{bmatrix} I \\ P \end{bmatrix} = 0 + d \cdot P = d \cdot P = p$$

In other words, the syndrome vector is the parity vector, S=p, according to some embodiments. If the received parity vector is an all-one vector, then:

$$S = [1, d] \cdot \begin{bmatrix} I \\ P \end{bmatrix} = 1 + d \cdot P = \overline{dP} = \overline{p}W$$

where $\overline{dP}$ is the bitwise inverse of dP, which can alternatively be represented as $\overline{dP}=\text{NOT}(dP)=\text{NOT}(p)$. In other words, the syndrome vector is the binary inverse of the parity vector. A linear operation, such as linear operation 522, can be used to invert the syndrome vector to generate the parity vector. In a more general embodiment, for any received parity vector, π:

$$S = [\pi, d] \cdot \begin{bmatrix} I \\ P \end{bmatrix} = \pi + d \cdot P = \pi + p$$

That is, the syndrome vector equals the received parity vector plus the parity vector. Accordingly, over a binary Galois field where addition and subtraction are the same linear operation:

$$p = S + \pi$$

In other words, the parity vector is the syndrome vector plus the received parity vector. This is a syndrome-to-parity conversion. A linear operation, such as linear operation 522, can be used to add the received parity vector from the received vector 504 to the syndrome vector to generate the parity vector.

Accordingly, a parity vector, P, is generated from the syndrome coefficients according to:

$$p = [S_o, S_1, S_3] \cdot F + \pi$$

Where F is the mapping matrix 518 and adding the received parity vector, π, is the linear operation 522 to generate a parity vector 524. In a general example, a parity vector, P, is generated from the syndrome coefficients according to:

$$p = [S_0, S_1, \ldots] \cdot F + \pi$$

As discussed previously, conventionally, parity vectors are computed using a parity matrix. Similarly, conventional syndrome decoding makes use of both error-locating polynomials and error-correcting polynomials, which can be computation-intensive and area-intensive. Comparatively, utilizing the syndrome coefficient computations to generate the parity vector enables area reduction on a chip, without loss in performance.

Returning to FIG. 5, the mapping matrix 518 receives the first syndrome coefficient 508, the second syndrome coefficient 512, and the third syndrome coefficient 516. As discussed previously, the mapping matrix 518 is represented by F, where S=[$S_0$, $S_1$, $S_3$]·F. Accordingly, the mapping matrix 518 generates a syndrome vector 520.

According to some embodiments, the linear operation 522 is applied to the syndrome vector 520 generated by the mapping matrix 518 to generate the parity vector 524. For example, in an embodiment wherein the received parity vector is an all-zero vector, a linear operation 522 is not necessary to generate the parity vector 524 because the syndrome vector 520 is the parity vector. In an embodiment wherein the received parity vector is an all-one vector, a linear operation 522 of a bit-wise inversion is used to generate the parity vector 524 from the syndrome vector 520. In another embodiment, a linear operation 522 the includes adding the received parity vector to the syndrome vector 520 can be used to generate the parity vector. In such embodiments, the linear operation 522 may receive the received vector 504, as shown in FIG. 5. The linear operation 522 may be any linear operation in the Galois field over which the error correcting code is designed.

In instances where the received vector 504 is to be encoded, the process as described thus far is used to generate the parity vector 524. In embodiments wherein the received vector 504 contains a payload to be encoded, but not a received parity vector, the received parity vector is effectively an all-zero vector, as described in example computations above. Accordingly, the parity vector 524 is generated, optionally omitting the linear operation 522. The parity vector 524 generated through the syndrome-to-parity conversion is joined with the received vector 504 to generate a codeword 526, thus encoding the received vector 504. For example, c=[d, p], where e is the codeword 526, d is the payload of the received vector 504, and P is the parity vector 524.

Returning to instances where the received vector 504 is to be decoded, an error circuit 528 receives the parity vector 524 and one or more syndrome coefficients, such as the first syndrome coefficient 508, the second syndrome coefficient 512, and the third syndrome coefficient 516. The error circuit 528 contains arithmetic processing units or algebraic blocks for locating and correcting errors, if present. According to some embodiments, the error circuit 528 includes an error locator 530 and an error corrector 532 to locate and correct errors, respectively, if errors are present. The error circuit 528 generates a decoded data vector 534 as an output.

The error locator 530 determines the location of errors in the received vector 504, if error(s) are present. If the received vector 504 is not a codeword of the error correcting code, then one or more errors are present. The error locator 530 determines the number of and the locations (i.e., bit positions) of any errors within the received vector 504. For example, the error locator 530 determines a number of errors in the received vector 504 based on the parity vector 524. The error locator 530 determines a set of error locations in the received vector 504, the set of error locations comprising a location of each error in the number of errors. In embodiments where the received vector 504 is a received vector that includes a received data vector and a received parity vector, the error locator 530 determines a set of locations of errors in the received parity vector and/or the received data vector. In some embodiments, the error locator 530 uses one or more error-locating polynomials to determine error locations. In some embodiments, the error locator 530 uses a look-up table.

According to some embodiments, the error locator 530 uses syndrome decoding to locate errors based on the parity vector 524, the first syndrome coefficient 508, the second syndrome coefficient 512, and the third syndrome coefficient 516. For example, if each of the syndrome coefficients (first syndrome coefficient 508, second syndrome coefficient 512, third syndrome coefficient 516) have values equal to zero, then no errors are present; the received data vector of the received vector 504 is the data vector 534. Alternatively, if any of the syndrome coefficients contain non-zero values, then one or more errors are present in the received vector 504. In such instances, for example, the syndrome coefficients are provided to computational units (e.g., arithmetic or algebraic blocks) that are configured to determine a set of error locator polynomial coefficients. The resulting error locator polynomial can be used to determine the locations of errors in the received vector 504.

The error corrector 532 corrects errors at locations determined by the error locator 530. If one or more errors are present in the received vector 504, the error corrector 532 corrects the errors to generate the data vector 534. The error corrector 532 determines the correct value associated with the locations determined by the error locator 530 within the received vector 504. In some embodiments, the error corrector 532 determines a corrected value for each value at the error locations in the received vector 504 based on the parity bits in the parity vector 524. In embodiments where the received vector 504 includes a received data vector and a received parity vector, the error corrector 532 corrects the errors in the received parity vector and/or the received data vector. In embodiments where the error correcting code is over a binary Galois field, the error corrector 532 corrects errors by flipping the bits at the error locations determined by the error locator 530. In some embodiments, the error corrector 532 uses one or more error correcting polynomials to determine error corrections.

According to some embodiments, the error circuit 528 determines location and correction of errors based on the parity vector 524. In an example, values in the parity vector 524 are redundant values that can be used to reconstruct any corrupted values in the received data vector. This differs from conventional methods, wherein the received parity vector cannot necessarily be used to reconstruct the received vector 504 when errors are present. For example, if the received parity vector itself contains one or more errors, then the erroneous values inhibit use of the received parity vector to reconstruct values. On the other hand, the generated parity vector 524 does not contain errors, and therefore can be used to reconstruct the values in the received vector 504.

Using the generated parity vector 524 in combination with a syndrome decoding method, such as an error locator polynomial, increases the minimum Hamming distance, $d_{min}$, of the error correcting code by 1. That is, the number of errors capable of being corrected by the error correcting code, t, increases when the syndrome-to-parity conversion is used to help locate errors. As a result, the previously discussed formula for the maximum number of errors capable of being corrected by an error correcting code is modified by the syndrome to parity conversion to:

$$t = \left\lfloor \frac{(d_{min}+1)-1}{2} \right\rfloor = \left\lfloor \frac{d_{min}}{2} \right\rfloor$$

Accordingly, the number of (and probability of) cases where there are too many errors (TME) for the error correcting code to correct is reduced. A reduction in TME improves the usefulness of the error correcting code and decreases the likelihood that a received vector 504 will be undecipherable.

After locating and correcting (e.g., reconstructing) any erroneous values in the received vector 504, the resultant vector is the data vector 534. Accordingly, the decoding method is complete.

The parity vectors 524 generated by the error correction system 500 can be used in both encoding and decoding. For example, the error circuit 528 may use the parity vector 524 to decode a received vector 504. Likewise, a received vector 504 can be encoded by the syndrome-to-parity conversion discussed above. For example, since the syndrome-to-parity conversion works for any received parity vector, π, any faux received parity vector may be used to calculate a parity vector to encode a data vector. In some embodiments, an all-zero faux received parity vector may be used to generate a parity vector by the syndrome-to-parity conversion and encode a data vector.

The error correction system 500 improves over existing BCH error correcting codes by reducing chip area, and thereby being more cost-efficient. Syndrome decoding calculations can be complex and thereby area intensive. The syndrome-to-parity conversion decreases the complexity of the calculations when compared to conventional methods. Further, the error correction system 500 can be used to further reduce chip area by using the error correction system 500 to perform both encoding and decoding operations. The need for a separate encoder circuit can be eliminated by making use of the syndrome-to-parity conversion circuitry for both encoding and decoding operations.

Figure 6:
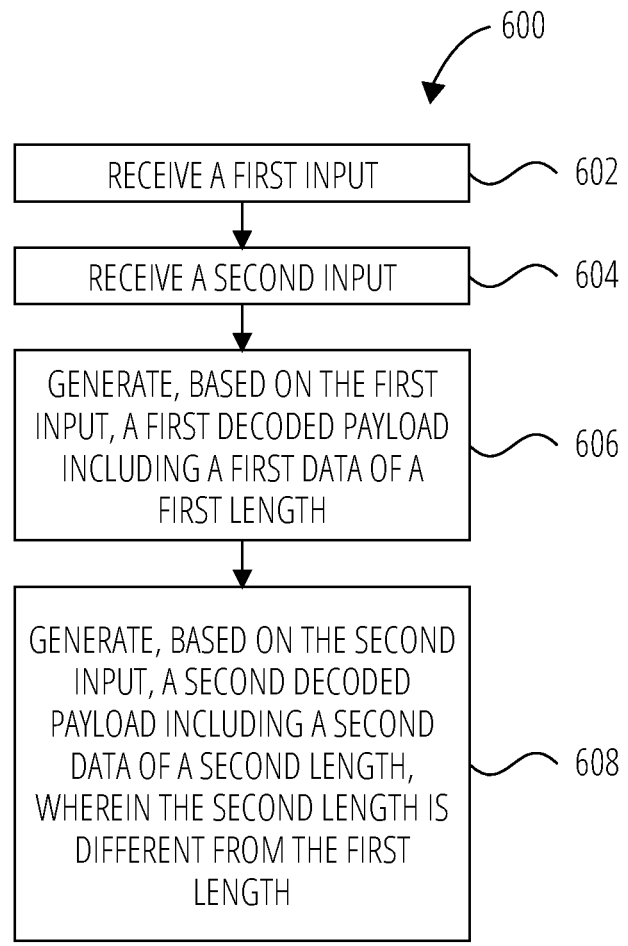
FIG. 6 illustrates generally an example of a method of decoding payloads of multiple lengths, according to some embodiments

FIG. 6 is a flowchart for a method 600 of decoding payloads of multiple lengths, according to some embodiments. The method 600 can be performed by processing logic that can include hardware (e.g., a processing device, circuitry, dedicated logic, programmable logic, microcode, hardware of a device, one or more integrated circuits, etc.), software (e.g., instructions run or executed on a processing device), or a combination thereof. In some embodiments, the method 600 is performed by functional components of computing system 100, such as the memory system 104. In some embodiments, the method 600 is performed by functional components of the CXL system 200. While the operations below are described as being performed by an integrated circuit, it shall be appreciated that the operations of method 600 may not necessarily be performed by the same integrated circuit. Accordingly, any one or more of the operations of the method 600 can be performed by any one or more hardware, software, or combination thereof.

Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 602, the integrated circuit receives a first input. At operation 604, the integrated circuit receives a second input. The first input and the second input were encoded, e.g., by encoder 306, and transmitted over a channel to the integrated circuit. For example, an encoder circuit generates the first input based on a first data of a first length, where the first input is a codeword of a BCH code. The encoder circuit also generates the second input based on a second data of a second length, where the second input is a codeword of the BCH code. The first length optionally differs from the second length.

In some embodiments, the encoder circuit additionally receives a first flip bit and receives a second flip bit. The first flip bit and the second flip bit indicate a bitwise polarity of the first data and the second data, respectively. That is, the first flip bit and the second flip bit are associated with a first value (e.g., 0) to indicate correct polarity, and are associated with a second value (e.g., 1) to indicate inverted polarity. The encoder circuit generates the first input based at least in part on the first flip bit. The encoder circuit generates the second input based at least in part on the second flip bit.

In some embodiments, the encoder circuit receives a first payload option bit and receives a second payload option bit. The first option bit indicates the first data has a length equal to the first length. In an example, the second payload option bit is different from the first payload option bit (e.g., 0 and 1, respectively). The second payload option bit indicates the second data has a length equal to the second length. The encoder circuit generates the first input based at least in part on the first payload option bit. The encoder circuit generates the second input based at least in part on the second payload option bit.

According to some embodiments, the BCH code used by the encoder circuit is configured to correct multiple errors. For example, the BCH code is configured to correct up to two errors. In some embodiments, the BCH code is designed to include or use a parity matrix that contains a number of extra rows, the number of extra rows being equal to the difference between the first length and the second length. The bitwise sum of each row in the extra rows is zero. The extra rows are designed to accommodate or enable encoding of multiple different lengths of data.

At operation 606, the integrated circuit generates, based on the first input, a first decoded payload including the first data of the first length. At operation 608, the integrated circuit generates, based on the second input, a second decoded payload of the second data of the second length, wherein the second length is different from the first length. According to some embodiments, the integrated circuit additionally receives the first payload option bit and the second payload option bit, each indicating the length of the respective payload. The integrated circuit uses one or more decoding methods to generate the first decoded payload and the second decoded payload.

In some embodiments, the integrated circuit employs syndrome decoding to decode the first input and the second input. For example, the integrated circuit generates a first syndrome vector based on the first input and generates a second syndrome vector based on the second input. In another example, the integrated circuit generates a first set of syndrome coefficients based on the first input and generates a second set of syndrome coefficients based on the second input. Additionally, the integrated circuit may make use of any operations discussed below in relation to a method 700 of FIG. 7 to decode the first input and/or the second input.

Figure 7:
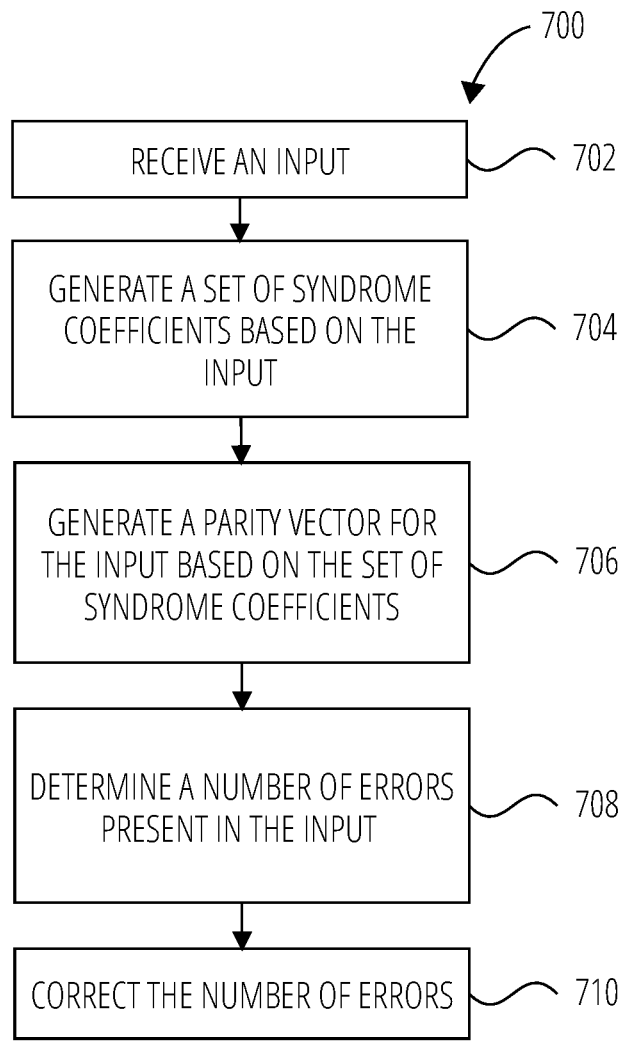
FIG. 7 illustrates generally an example of a method of error correction, according to some embodiments.

FIG. 7 is a flowchart for the method 700 of error correction, according to some embodiments. The method 700 can be performed by processing logic that can include hardware (e.g., a processing device, circuitry, dedicated logic, programmable logic, microcode, hardware of a device, one or more integrated circuits, etc.), software (e.g., instructions run or executed on a processing device), or a combination thereof. In some embodiments, the method 700 is performed by functional components of the computing system 100, such as the memory system 104. In some embodiments, the method 700 is performed by functional components of the C×L system 200. While the operations below are described as being performed by an integrated circuit, it shall be appreciated that the operations of method 700 may not necessarily be performed by the same integrated circuit. Accordingly, any one or more of the operations of the method 700 can be performed by any one or more hardware, software, or combination thereof.

Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 702, the integrated circuit receives an input. The input includes a received data vector and a received parity vector. The integrated circuit receives the input over a channel. Accordingly, the input may include a number of errors that distort the data vector and/or the parity vector. It should be noted that the number of errors may be zero. That is, if the number of errors present is zero, then no errors are present.

In some embodiments, the input is generated outside of the integrated circuit. For example, a codeword is generated, where the codeword is a codeword of an error correcting code. According to some embodiments, the error correcting code is a BCH code designed to correct multiple errors. The codeword is transmitted to the integrated circuit. In transmission, a number of errors can be introduced to the codeword, thereby generating the input. That is, the input is the codeword with any errors.

At operation 704, the integrated circuit generates a set of syndrome coefficients based on the input. There may be any number of syndrome coefficients to be generated, based on the design of the error correcting code. Each syndrome coefficient is associated with a syndrome coefficient generator in the integrated circuit. Each syndrome coefficient, $S_j$, is generated according to $S_j=y(\alpha^j)$, for any J=0, 1 . . . 2t−1, where t is the number of errors the error correcting code is capable of correcting. In an example, the set of syndrome coefficients generated at operation 704 can include a single member set with one syndrome coefficient.

At operation 706, the integrated circuit generates a parity vector for the input based on the set of syndrome coefficients. According to some embodiments, this syndrome-to-parity conversion includes multiplying the set of syndrome coefficients by a mapping matrix. The mapping matrix (e.g., mapping matrix 518) provides a mapping between the set of syndrome coefficients and a syndrome vector. The mapping matrix is invertible: $F=E^{-1}$. Accordingly, $S=[S_0, S_1, S_3] \cdot F$ and $[S_0, S_1, S_3]=S \cdot E$. Further, according to some embodiments, a linear operation is used to convert the syndrome vector to the parity vector. For example, the linear operation is adding the received parity vector to the syndrome vector to generate the parity vector.

At operation 708, the integrated circuit determines a number of errors present in the input. For example, if any of the syndrome coefficients is non-zero, then one or more errors are present. Alternatively, if the syndrome coefficients are all zero, then the number of errors present is zero errors.

At operation 710, the integrated circuit corrects the number of errors present. If there are zero errors, then correction is not necessary. If one or more errors are present, then the parity vector can be used to reconstruct the correct values at every location in the input, including the received parity vector and the received data vector. After errors are located and corrected in the received data vector, the data vector is decoded.

Reference throughout this specification to "one embodiment" or "an embodiment" means that a particular feature, structure, or characteristic described in connection with the embodiment is included in at least one embodiment of claimed subject matter. Thus, the appearances of the phrase "in one embodiment" or "an embodiment" in various places throughout this specification are not necessarily all referring to the same embodiment. Furthermore, the particular features, structures, or characteristics may be combined in one or more embodiments.

Glossary

"Bose Chaudhuri Hocquenghem code" or "BCH code" refers to a class of linear cyclic error correcting codes constructed using polynomials over a Galois field. Designing BCH codes gives the designer control over the number of elements in the transmitted data that can be corrected by the BCH code. BCH codes can be decoded using syndrome decoding.

"Code" refers to a system and/or method used to encode and/or decode data. In the case of encoding, the code generates encoded data from unencoded data (e.g., a data vector). The code can generally also be used to decode the encoded data into the unencoded data. For example, a code may be an algorithm that uniquely represents data from one source set of symbols (e.g., an alphabet) as an encoded version of the data in another set of symbols (e.g., Morse code). Encodings are distinct from encryption.

A code is denoted by C.

"Codeword" refers to an encoded word without any errors. A codeword is generated by encoding data (e.g., a data vector) with a code. In error correcting codes, including BCH codes, the codeword contains redundant elements to enable error location and error correction. A codeword is a type of word.

A codeword is denoted by c and has a length of n in some instances.

"Cyclic code" refers to a subclass of error correcting codes for which any cyclic shift of a codeword is also a codeword.

"Data vector" refers to data to be encoded. The data may include a word or be any other type of readable/writable data, such as a data stream. Mathematically this data can be represented as a vector. The data vector may contain bits, numbers, letters, or any other type of characters.

A data vector is denoted by d and has a length of k in some instances.

"Error correcting code" refers to systems and methods for controlling errors in data transmitted over a potentially noisy channel. Error correcting codes are capable of both identifying locations of errors (error detection) and correcting errors located (error correction). Error correcting codes use redundancies in data transmitted to detect and correct errors.

"Error vector" refers to one or more errors in a received vector. A received vector is equal to y=c+e for linear codes. In the event a received vector is a codeword, the error vector is an all-zero vector.

An error vector is denoted e and has a length of n, or otherwise the length of the received vector, in some instances.

"Galois field" refers to a mathematical field that contains a finite number of elements. Also sometimes referred to as a "finite field," a Galois field is a finite set which is a field and satisfies the field axioms of addition, multiplication, subtraction, and division, which are often modular operations in Galois fields, resulting in a cyclic field.

A Galois field can be denoted by $\mathbb{F}_q$, $F_q$, or GF(g), where q denotes the order (i.e., size) of the Galois field. A Galois field of order q exists if and only if $q=p^i$, where P is a prime number and i is a positive integer.

"Generator matrix" refers to a matrix used to generate codewords of a linear code. All of the codewords of the code are generated by linear combinations of the rows of the generator matrix. That is, the code is the row space of the generator matrix. In a systematic for of a BCH codes, the generator matrix can be generated based on the k-dimensional identity matrix and the parity matrix.

A generator matrix is denoted by G and has dimensions k×n in systematic form, in some instances.

"Generator polynomial" refers to a polynomial used to generate codewords of a cyclic code. Any polynomial that is a multiple of the generator polynomial is a valid codeword. A generator polynomial can be generated based on minimal polynomials for a cyclic code. For example, in some types of BCH codes, the generator polynomial is the least common multiple of the minimal polynomials of a primitive element.

A generator polynomial is denoted by g(x).

"Hamming distance" refers to the number of positions at which the corresponding element is different between two words of equal length.

"Linear code" refers to a subclass of error correcting codes for which any linear combinations of codewords is also a codeword. A linear code may be decoded using syndrome decoding.

"Minimal polynomial" refers to a unique monic polynomial for a primitive element in a Galois field. For an element ox in GF(q), or GF(q''') in general, the minimal polynomial is a polynomial of the lowest degree and having coefficients all belonging to GF(q), such that α is a root of the polynomial. Minimal polynomials are irreducible. If a minimal polynomial of α exists, then it is unique. Minimal polynomials are used in field extensions.

A minimal polynomial of α is denoted $m_i(x)$, where $m_i(\alpha)=0$, for some integer i.

"Minimum Hamming distance" refers to the smallest Hamming distance between all possible pairs of words in a set. Minimum Hamming distance of a BCH code is related to the number of errors the BCH code is capable of correcting.

A minimum Hamming distance is denoted by $d_{min}$.

"Parity check matrix" refers to a matrix used to decide whether a received vector is a codeword. A parity check matrix can be used in decoding algorithms. Every valid codeword in a given code is orthogonal to the parity check matrix. The parity check matrix can be generated in systematic form based on the transpose of the parity matrix and the (n−k)-dimensional identity matrix.

A parity check matrix is denoted by H and has dimensions (n−k)×n in systematic form.

"Parity matrix" refers to a matrix used to generate the parity vector. The parity matrix can also be used to generate the generator matrix as well as the parity check matrix. Designing the parity matrix is part of designing a BCH code.

A parity matrix is denoted by P and has dimensions k×(n−k).

"Parity vector" refers to a linear combination of redundancies generated by the code. For example, in a BCH code, the parity vector is generated by multiplying the data vector by the parity matrix. Combining the parity vector and the data vector results in a codeword. A parity vector is denoted by P and has length (n−k).

"Primitive element" refers to an algebraic element ox in a Galois field, GF(q), that is a primitive root of unity in GF(q). That is, every non-zero element in GF(q) can be written as $\alpha^i$ for some positive integer i. A primitive element may also be referred to as a "generator of the field"

A primitive element is denoted by @.

"Received parity vector" refers to values within a received vector that correspond to locations of parity vector values. A received parity vector differs from a parity vector in that the received parity vector may additionally have one or more errors present.

"Received vector" refers to a vector of data received to be encoded or decoded. In the instance where a received vector is to be decoded, a received vector differs from a codeword in that the received vector may additionally have one or more errors. That is, the received vector may be a codeword or just another word in the Galois field. Until the decoding process, it is unknown whether the received vector is a codeword or not. In the instance where a received vector is to be encoded, it contains a payload to be encoded. The payload can contain data, a flip bit, and/or a payload option.

A received vector is denoted by y and has length n.

"Syndrome coefficient" refers to values that make up the syndrome vector. In some syndrome decoding algorithms the syndrome coefficients are computed individually. A syndrome coefficient may be a scalar or vector value.

A syndrome coefficient is denoted by $s_j$, for some j.

"Syndrome decoding" refers to an algebraic method of minimum-distance decoding. Syndrome decoding uses syndrome vectors. Each syndrome vector is associated with one or more error patterns (i.e., number of errors and error location(s)).

"Syndrome vector" refers to a vector calculated by multiplying a received vector by the parity check matrix. A received vector is a codeword if and only if the syndrome vector computes to zero. A nonzero syndrome vector indicates one or more errors have been received. A syndrome vector is denoted by s and has length (n–k).

"Word" refers to a string of elements. The word has a finite length and finite ordering of elements. Elements may be numbers, letters, bits, or any other symbols. For example, in a binary context, a word refers to a string of bits.

What is claimed is:

1. An apparatus comprising:
a decoder circuit, configured to:
receive a first input;
receive a second input;
generate, based on the first input, a first decoded payload, the first decoded payload comprising a first data of a first length and a first flip bit; and
generate, based on the second input, a second decoded payload, the second decoded payload comprising a second data of a second length and a second flip bit, wherein the first length is less than the second length; and
an encoder circuit, configured to:
generate, based on the first data of the first length and the first flip bit, the first input, wherein the first input is a codeword of a Bose-Chaudhuri-Hocquenghem (BCH) code; and
generate, based on the second data of the second length and the second flip bit, the second input, wherein the second input is a codeword of the BCH code.

2. The apparatus of claim 1, wherein the BCH code is configured to correct multiple errors.

3. The apparatus of claim 2, wherein the BCH code has a parity matrix wherein the parity matrix contains a number of extra rows, the number of extra rows being equal to a difference between the first length and the second length, wherein a bitwise sum of each row in the number of extra rows is zero.

4. The apparatus of claim 1, wherein the encoder circuit is further configured to:
receive a first payload option bit, the first payload option bit indicating the first data has a length equal to the first length, and
receive a second payload option bit, the second payload option bit being different from the first payload option bit, the second payload option bit indicating the second data has a length equal to the second length.

5. The apparatus of claim 1, wherein the decoder circuit is further configured to:
receive a first payload option bit, the first payload option bit indicating the first data has a length equal to the first length, and
receive a second payload option bit, the second payload option bit being different from the first payload option bit, the second payload option bit indicating the second data has a length equal to the second length.

6. The apparatus of claim 1, wherein the decoder circuit is further configured to:
generate a first syndrome based on the first input, and
generate a second syndrome based on the second input.

7. The apparatus of claim 1, wherein the first flip bit indicates a bitwise polarity of the first data.

8. An error correction method comprising:
generating a first input, wherein the first input is a codeword of a Bose-Chaudhuri-Hocquenghem (BCH code) code;
receiving, at a processor circuit, the first input;
generating, at the processor circuit and based on the first input, a first decoded payload, the first decoded payload comprising a first data of a first length and a first flip bit;
generating a second input, wherein the second input is a codeword of the BCH code;
receiving, at the processor circuit, the second input; and
generating, at the processor circuit and based on the second input, a second decoded payload, the second decoded payload comprising a second data of a second length and a second flip bit, wherein the first length is less than the second length.

9. The error correction method of claim 8, wherein the BCH code is configured to correct multiple errors.

10. The error correction method of claim 9, wherein the BCH code has a parity matrix wherein the parity matrix contains a number of extra rows, the number of extra rows being equal to a difference between the first length and the second length, wherein a bitwise sum of each row in the number of extra rows is zero.

11. The error correction method of claim 8, wherein generating the first input further comprises:
receiving a first payload option bit, the first payload option bit indicating the first data has a length equal to the first length.

12. The error correction method of claim 11, wherein generating the second input further comprises:
receiving a second payload option bit, the second payload option bit being different from the first payload option bit, the second payload option bit indicating the second data has a length equal to the second length.

13. The error correction method of claim 8, wherein generating the first decoded payload further comprises:
receiving, at the processor circuit, a first payload option bit, the first payload option bit indicating the first data has a length equal to the first length.

14. The error correction method of claim 8, wherein the first decoded payload further comprises a first payload option bit, the first payload option bit indicating the first data has a length equal to the first length.

15. The error correction method of claim 8, wherein generating the first decoded payload further comprises:
generating a first syndrome based on the first input; and
generating a second syndrome based on the first input.

16. The error correction method of claim 8, wherein the first flip bit indicates a bitwise polarity of the first data.

17. A system comprising:
a processing element configured to issue at least one of a read operation or a write operation; and
a memory device comprising:

a first processor configured to:
  receive a first input, and
  receive a second input;
  generate, based on the first input, a first decoded payload, the first decoded payload comprising a first data of a first length and a first flip bit; and
  generate, based on the second input, a second decoded payload, the second decoded payload comprising a second data of a second length and a second flip bit, wherein the first length is less than the second length; and
a second processor configured to:
  generate, based on the first data of the first length and the first flip bit, the first input, wherein the first input is a codeword of a Bose-Chaudhuri-Hocquenghem (BCH code) code, and
  generate, based on the second data of the second length and the second flip bit, the second input, wherein the second input is a codeword of the BCH code.

* * * * *